(12) United States Patent
Itoh

(10) Patent No.: US 7,906,257 B2
(45) Date of Patent: Mar. 15, 2011

(54) PHOTOMASK MANUFACTURING METHOD AND SEMICONDUCTOR DEVICE MANUFACTURING METHOD

(75) Inventor: Masamitsu Itoh, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 424 days.

(21) Appl. No.: 12/026,293

(22) Filed: Feb. 5, 2008

(65) Prior Publication Data

US 2008/0311486 A1  Dec. 18, 2008

(30) Foreign Application Priority Data

Feb. 5, 2007 (JP) .................................. 2007-025977

(51) Int. Cl.
*G03F 1/00* (2006.01)
*G03C 5/00* (2006.01)
(52) U.S. Cl. ............................. 430/5; 430/311; 430/394
(58) Field of Classification Search .............. 430/5, 311, 430/394
See application file for complete search history.

(56) References Cited

U.S. PATENT DOCUMENTS

| 6,566,016 | B1 * | 5/2003 | Ziger ................................. 430/5 |
| 6,821,682 | B1 * | 11/2004 | Stearns et al. ..................... 430/5 |
| 7,049,033 | B2 | 5/2006 | Stearns et al. |
| 7,563,547 | B2 * | 7/2009 | Park et al. ......................... 430/5 |
| 2008/0026300 | A1 | 1/2008 | Itoh et al. |

FOREIGN PATENT DOCUMENTS

| JP | 4-346214 | 12/1992 |
| WO | WO 2005/008333 | 1/2005 |

* cited by examiner

Primary Examiner — Stephen Rosasco
Assistant Examiner — Rashid Alam
(74) *Attorney, Agent, or Firm* — Oblon, Spivak, McClelland, Maier & Neustadt, L.L.P.

(57) ABSTRACT

A photomask manufacturing method. A pattern dimensional map is generated by preparing a photomask in which a reflective layer formed on a substrate and an absorber pattern is formed on the layer. A reflection correction coefficient map is generated by dividing a mask region, where the absorber pattern is formed, into a plurality of subregions, and determining a reflection correction coefficient for each subregion. The reflection correction value of each subregion is calculated based on the dimensional difference indicated in the pattern dimensional map and the reflection correction coefficient of each subregion. A reflection coefficient of each reflective layer region corresponding to each subregion is changed based on the reflection correction value.

20 Claims, 6 Drawing Sheets

[Fig. 2]
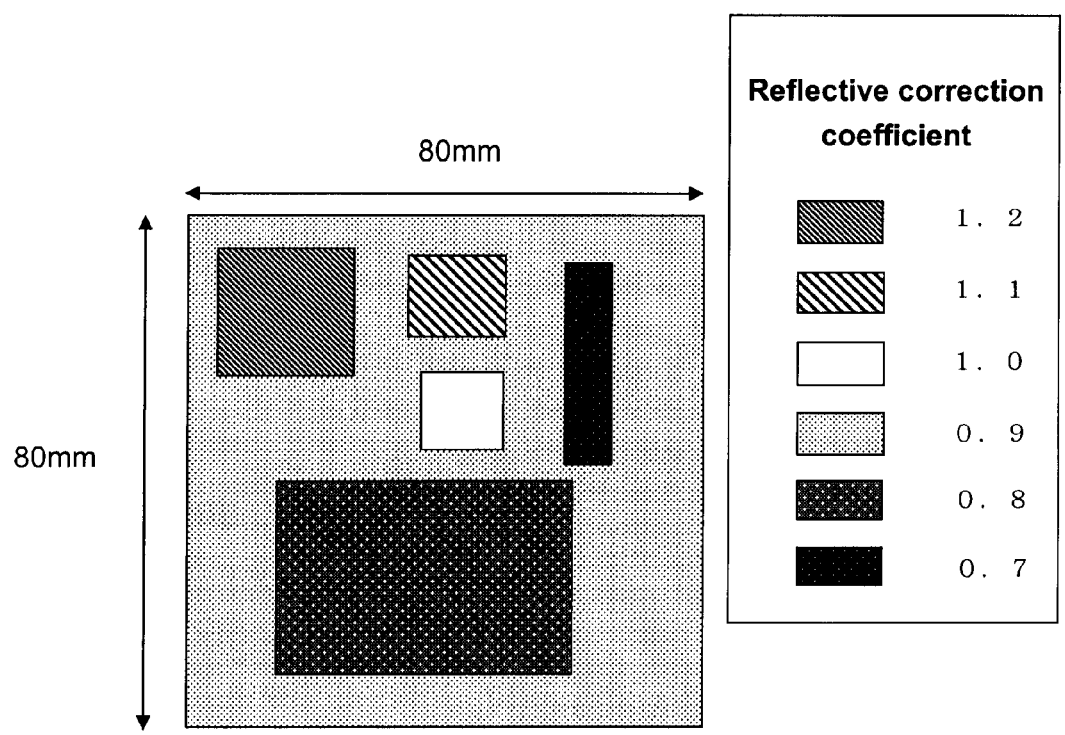

[Fig. 3 (a)]
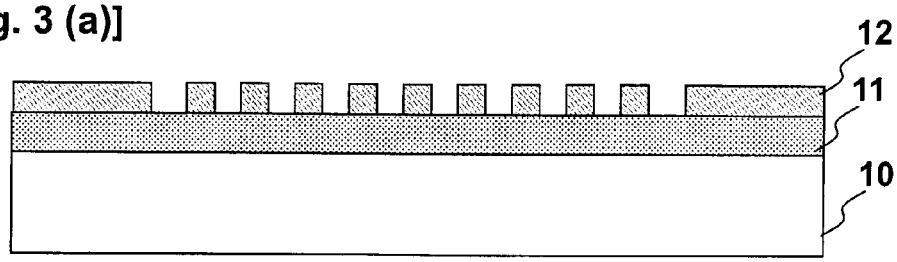
[Fig. 3 (b)]
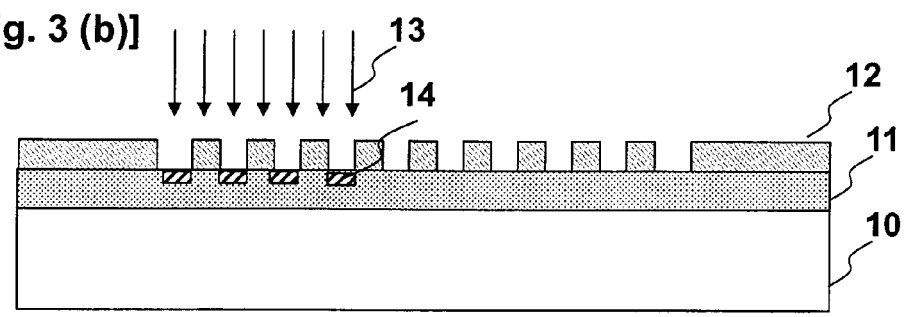
[Fig. 3 (b')]
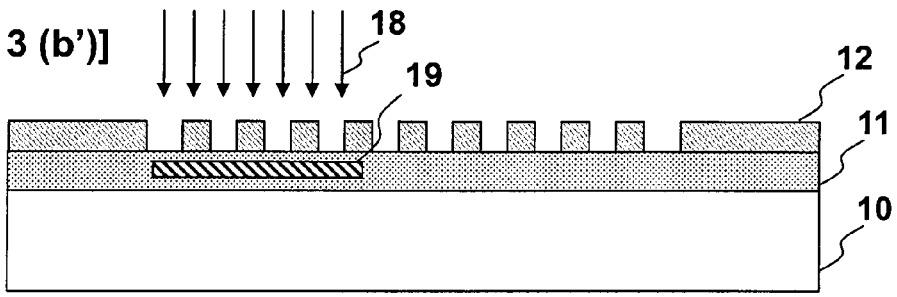
[Fig. 3 (c)]
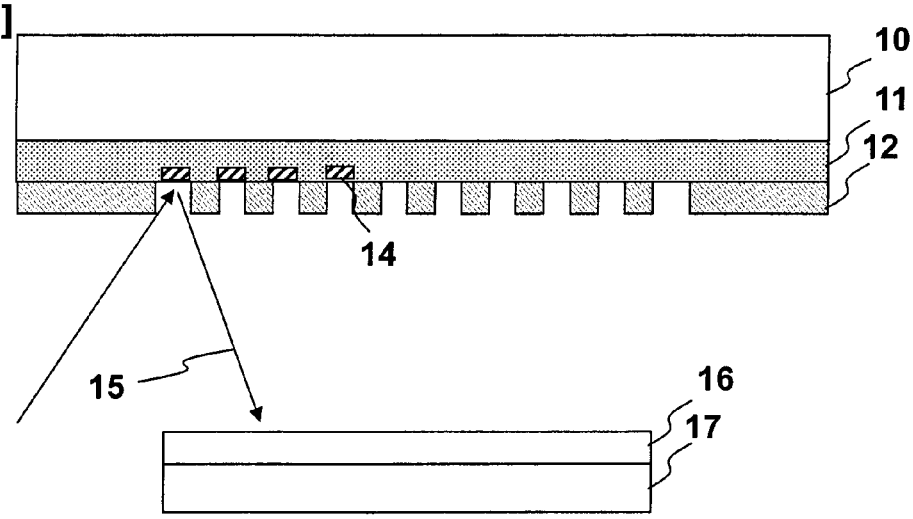

[Fig. 4]
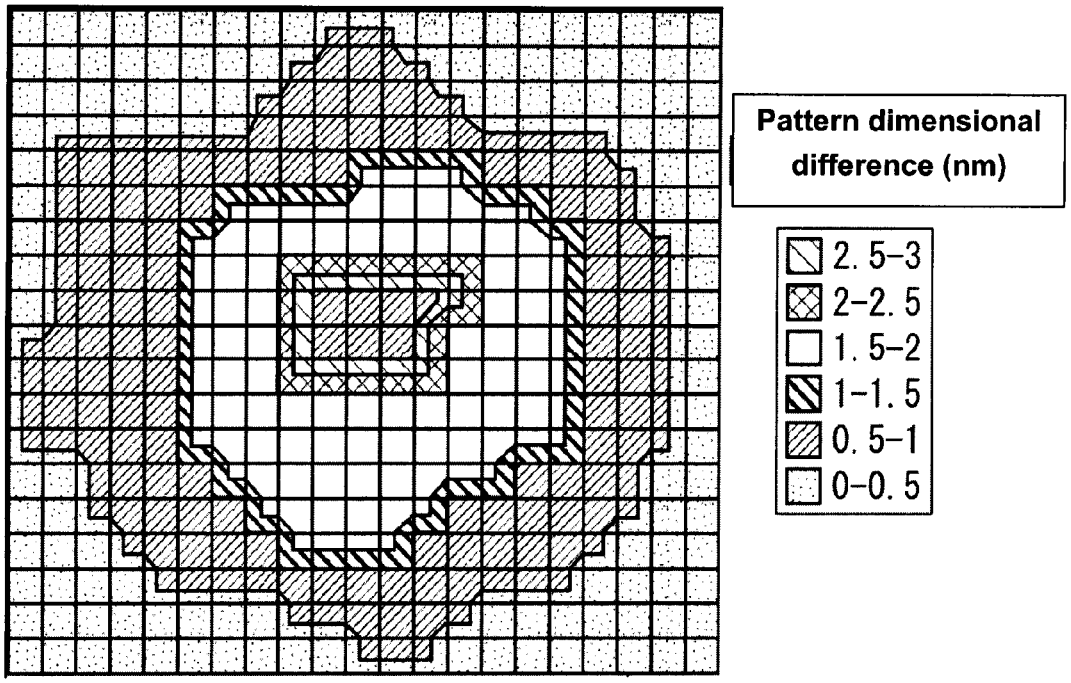
[Fig. 5]
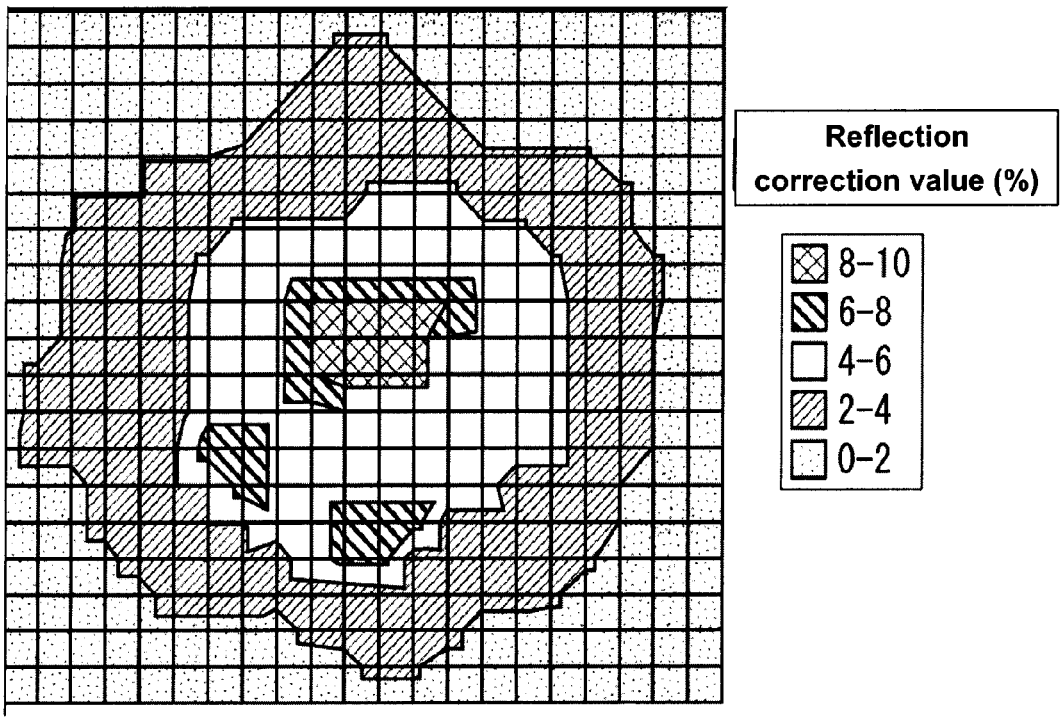

[Fig. 7]
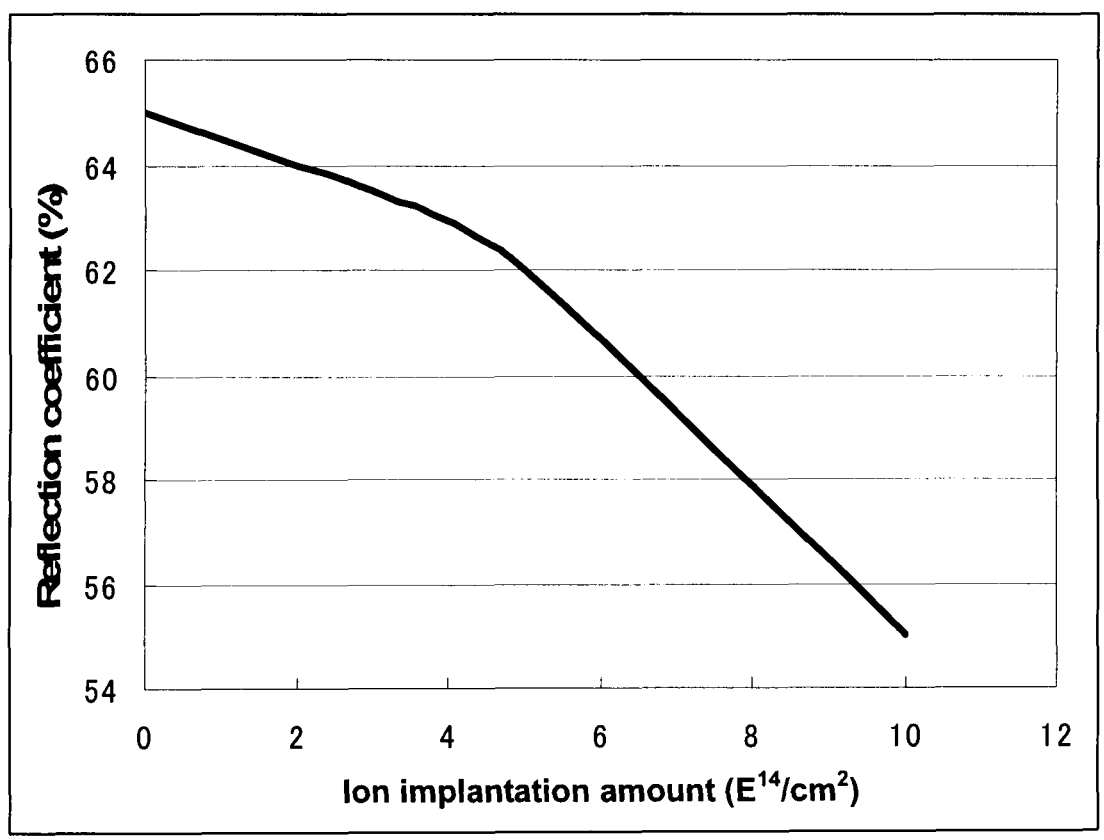

PHOTOMASK MANUFACTURING METHOD AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2007-25977, filed Feb. 5, 2007, the entire contents of which are incorporated herein by reference.

BACKGROUND OF THE INVENTION

1. Field of the Invention

The present invention relates to a method of manufacturing a photomask including an absorber pattern on a reflective layer and, more particularly, to a method of manufacturing a photomask in a part of which the reflection coefficient of the absorber layer is changed. The present invention also relates to a semiconductor device manufacturing method using a photomask manufactured by this method.

2. Description of the Background Art

Along with the recent advance in the micropatterning of semiconductor devices, a demand for patterning with an EUV (Extreme Ultra Violet) lithography process has been increasing. The design rule of leading-edge devices has already reduced the half pitch (hp) to around 32 nm. An exposure technique using the EUV lithography process manages to cope with this micropatterning.

In the EUV lithography process a reflective mask has been used, the reflective mask having a multi-layered reflective layer comprised of silicon film and molybdenum film formed on a substrate and an absorber pattern comprised mainly of Tantalum formed on the reflective layer. Under these circumstances, the pattern dimensional uniformity required for the reflective mask is increasingly becoming stricter. To correct mask pattern dimensions of a transparent mask, a technique of changing the transmittance of a quartz substrate is available. This technique decreases the transmittance of quartz at a relatively large opening of the mask pattern within the mask plane (e.g., see A2 in PCT [WO] 2005/008333).

However, using this technique, the transmittance of the transparent mask may be changed, while the reflection coefficient of the reflective mask cannot be sufficiently changed. Moreover, this approach adjusts the amount of the transmittance change of the quartz substrate with a certain rule based only on a dimensional difference between the pattern actually formed on the substrate and the design pattern corresponding to the pattern. As a result, the pattern dimensions of the reflective mask cannot be corrected accurately and an appropriate amount of pattern correction suited to the mask pattern dimensions cannot be obtained.

SUMMARY OF THE INVENTION

According to an aspect of the present invention, a photomask manufacturing method comprises: preparing a photomask having a reflective layer formed on a substrate and an absorber pattern formed on the reflective layer; generating a pattern dimensional map on the photomask, the pattern dimensional map indicating distribution of a dimensional difference between a measured value of the absorber pattern and a design value of the absorber pattern; generating a reflection correction coefficient map by dividing a mask region, where the absorber pattern is formed, into a plurality of subregions and determining a reflection correction coefficient for each subregion; calculating a reflection correction value of each subregion based on the dimensional difference indicated in the pattern dimensional map and the reflection correction coefficient of each subregion; and changing a reflection coefficient of each reflective layer region corresponding to each subregion on the basis of the reflection correction value.

According to another aspect of the present invention, a semiconductor manufacturing method comprises: preparing a photomask having a reflective layer formed on a substrate and an absorber pattern formed on the reflective layer, the photomask manufactured by generating a pattern dimensional map on the photomask, the pattern dimensional map indicating distribution of a dimensional difference between a measured value of the absorber pattern and a design value of the absorber pattern, generating a reflection correction coefficient map by dividing a mask region, where the absorber pattern is formed, into a plurality of subregions and determining a reflection correction coefficient for each subregion, calculating a reflection correction value of each subregion based on the dimensional difference indicated in the pattern dimensional map and the reflection correction coefficient of each subregion, and changing a reflection coefficient of each reflective layer region corresponding to each subregion based on the reflection correction value; and transferring the pattern of the photomask onto a wafer using the photomask.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a view illustrating an example of a reflection correction coefficient map used in the first embodiment;

FIGS. 3(a) to 3(c) are views showing a process of changing a reflection coefficient of an absorber layer of the reflective mask and transferring pattern formed on the reflective mask;

FIG. 4 is a view illustrating an example of a pattern dimensional map used in the first embodiment;

FIG. 5 is a view illustrating an example of a reflection correction value map used in the first embodiment;

FIG. 7 is a graph showing a relationship between an amount of ions implanted into the reflection layer and a changing rate of a reflection coefficient of the reflection layer.

DETAILED DESCRIPTION OF PREFERRED EMBODIMENTS

Embodiments of the present invention will be described in detail below with reference to the accompanying drawings.

Figure 1:
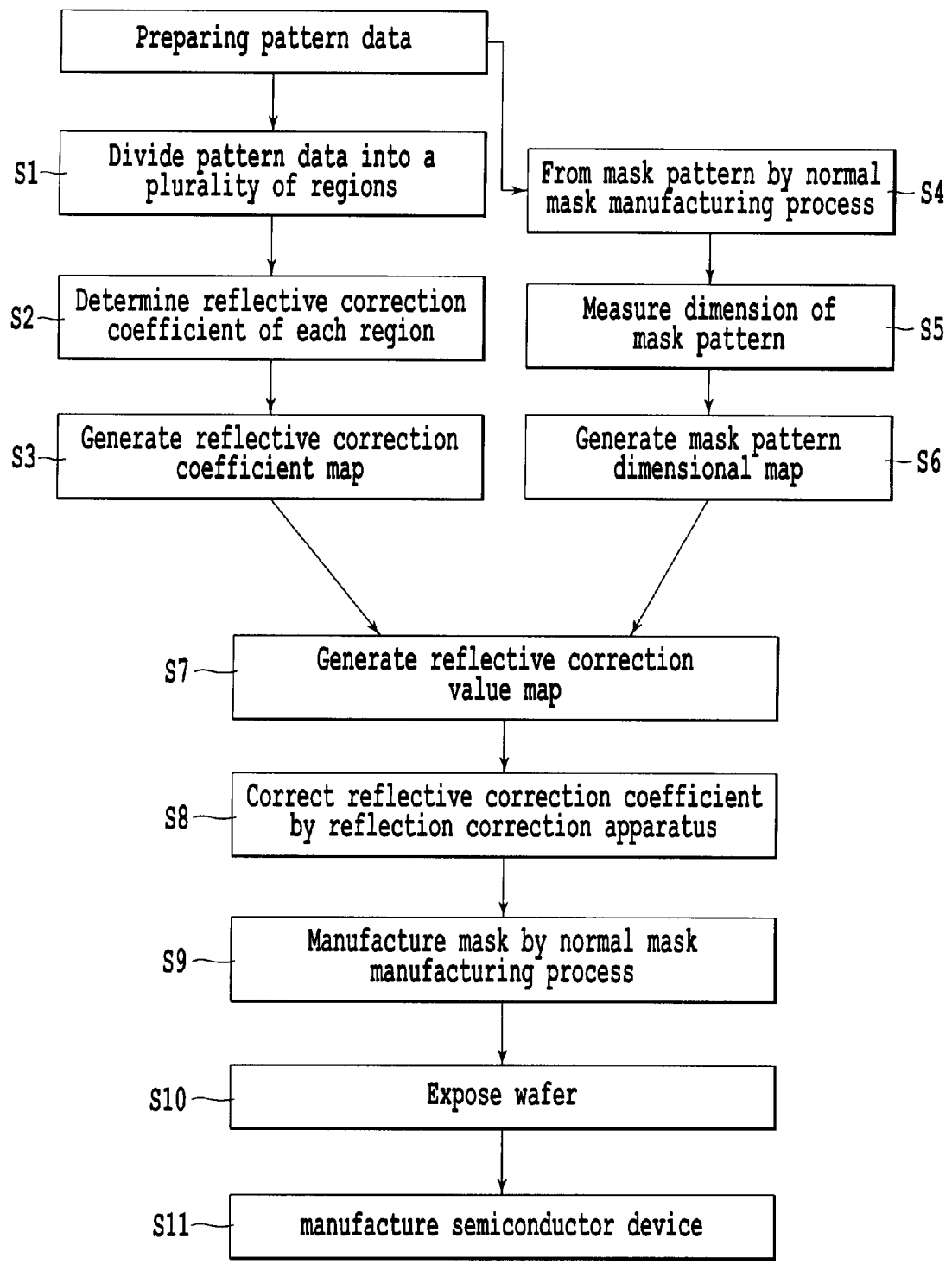
FIG. 1 is a flowchart showing a photomask manufacturing process according to a first embodiment of the present invention.

FIG. 1 is a flowchart for explaining a method of manufacturing a photomask (EUV mask) used in an EUV lithography process according to a first embodiment of the present invention. FIG. 1 shows a process until a semiconductor device is manufactured from photomask manufacturing.

The flowchart of FIG. 1 shows steps Sl-S11 performed in the process of manufacturing a semiconductor device. The steps S4-S6 have been known to be performed in a background mask manufacturing process, and result in generating a mask pattern dimensional map, discussed in further detail below. The applicants of the present invention recognized that uniformity of mask pattern dimensions can be improved by utilizing additional information than in steps S4-S6, to lead to improvements in semiconductor device manufacturing yield. Specifically, in features in the present invention a reflective correction coefficient map such as shown in FIG. 2 is generated by steps S1-S3 in FIG. 1, performed in parallel with steps S4-S6, and the information in that correction coefficient map is utilized in conjunction with the mask pattern dimensional map generated in step S6 in FIG. 1, and as shown in FIG. 4, to provide more accurate reflective corrections, as now discussed below.

First, 80-mm-square pattern data to be formed on a mask is divided into 1 mm-square regions (subregions) (step S1). A reflection correction coefficient is determined for each region (step S2). A reflection correction coefficient map such as shown in FIG. 2 is generated (step S3). The reflection correction coefficient is determined depending on the pattern size (pattern pitch). More specifically, the reflection correction coefficient is calculated using the average pattern pitch within 1 mm-square regions. It is the case that the narrower the pattern pitch within the region, the larger the reflection correction coefficient within the region, according to a relationship that the narrower the pattern pitch, the larger the dimensional difference between the design pattern dimension and the measured pattern dimension.

Further, as noted above, steps S4-S6 have been performed in a background mask manufacturing process, and in the present invention those steps S4-S6 are performed in parallel with steps S1-S3.

As shown in FIG. 3(a), a multi-layered reflective layer 11, for example made of a plurality of molybdenum (Mo) films and silicon (Si) films, is formed on a low-thermal expansion glass substrate 10, and an absorber pattern 12 as a mask pattern, for example made of tantalum (Ta), is formed on the reflective layer 11, by the background mask manufacturing process (step S4). After a defect inspection and/or a defect correction of the formed absorber pattern are/is performed, the dimensions of the pattern are measured, for example by a scanning electron microscope (SEM) (step S5). The pattern is, for example, measured at 441 points within the 80-mm-square region in a measured pitch of 4 mm. On the basis of this measurement data, an 80-mm-square pattern dimensional map as shown in FIG. 4 is generated (step S6).

This pattern dimensional map of FIG. 4 does not describe the pattern dimension values themselves, but describes the relative values that indicate a dimensional difference between the actual pattern formed on the mask and the design pattern corresponding to the actual pattern. Due to the principle that a reflection correction can decrease the reflection coefficient but cannot increase the reflection coefficient, this map shows the dimensional difference of patterns within each region setting a pattern region having a minimum dimensional difference as a reference. That is, this map describes all the values with positive signs. This map shows the larger the value, the larger the dimensional difference between the pattern width (i.e., the width of a pattern without any absorber) and the design pattern width. Thereby, a reflection coefficient of the pattern region having a larger value is required to be reduced more than that of a pattern region having a smaller value.

On the basis of the reflection correction coefficient map shown in FIG. 2 and the pattern dimensional map shown in FIG. 4, a reflection correction value is determined for each 1 mm-square region (step S7). That is, a reflection correction value is calculated by multiplying the reflection correction coefficient of an arbitrary 1 mm-square region divided as the reflection correction coefficient map by the pattern dimensional difference indicated in the pattern dimensional map corresponding to this region. A reflection correction value map as shown in FIG. 5 is thus generated. The value of this correction value map indicates the amount of reflection coefficient to be decreased. For example, if the reflection correction value in a region is 5, the reflection coefficient in the region is to be decreased by 5%. If the measurement points on the pattern dimensional map are spaced apart at a pitch of 4 mm, that is inconsistent with the region size of 1 mm in the reflection correction coefficient map. Therefore, in that instance intervals between the measurement points are interpolated by an interpolation method.

As shown in FIG. 3(b), an infrared laser beam 13 (YAG laser beam) is guided onto the reflective layer 11 to partially decrease its reflection coefficient (step S8). More specifically, using a laser reflection correction apparatus, a heterogeneous layer (a laser damaged layer 14) having a different reflective coefficient from that of the reflective layer 11 is formed in the reflective layer 11 by irradiating the infrared laser beam into each 1 mm-square layer region. A diffusion layer formed between, for example, a Mo film and Si film of the reflective layer 11 is enlarged when the laser beam laser is irradiated. At this time, the reflection correction apparatus reads the reflection correction value map of FIG. 5 to decrease the reflection coefficient in each region by following the reflection correction value map.

Using the normal photomask manufacturing process, mask cleaning and pellicle adhesion is performed to complete a photomask (step S9). As shown in FIG. 3(c), irradiating EUV light 15 onto this reflective EUV mask and reflecting the EUV light onto a resist 16 formed on a wafer 17 via a reflective optical system, the absorber pattern 12 is transferred onto the resist (step S10). More specifically, this photomask is set on the EUV exposure apparatus to transfer a device pattern having a half pitch of about 32 nm onto the resist 16 on the wafer 17. Furthermore, the wafer 17 is etched using the resist 16 as a mask to manufacture a semiconductor device (step S11).

Consequently, the in-plane uniformity of the mask pattern dimensions improves as compared with the background art that does not generate and utilize the reflection correction coefficient map of FIG. 2 generated in steps S1 to S3 and utilized in step S7. Thereby, the margin of lithography process is increased to be able to greatly improve the semiconductor device manufacturing yield.

According to the first embodiment, the reflection correction coefficient map as in FIG. 2 is generated for each predetermined region within the mask plane, and also the pattern dimensional map within the mask plane as in FIG. 4 is generated. The correction value of each reflection correction region is calculated on the basis of the reflection correction coefficient map and the pattern dimensional map. This makes it possible to adjust the reflection coefficient of the reflective layer with a higher accuracy than in the background art. It is therefore possible to manufacture a very fine semiconductor device having pattern half pitch as narrow as 32 nm or less with a high yield.

Figure 6:
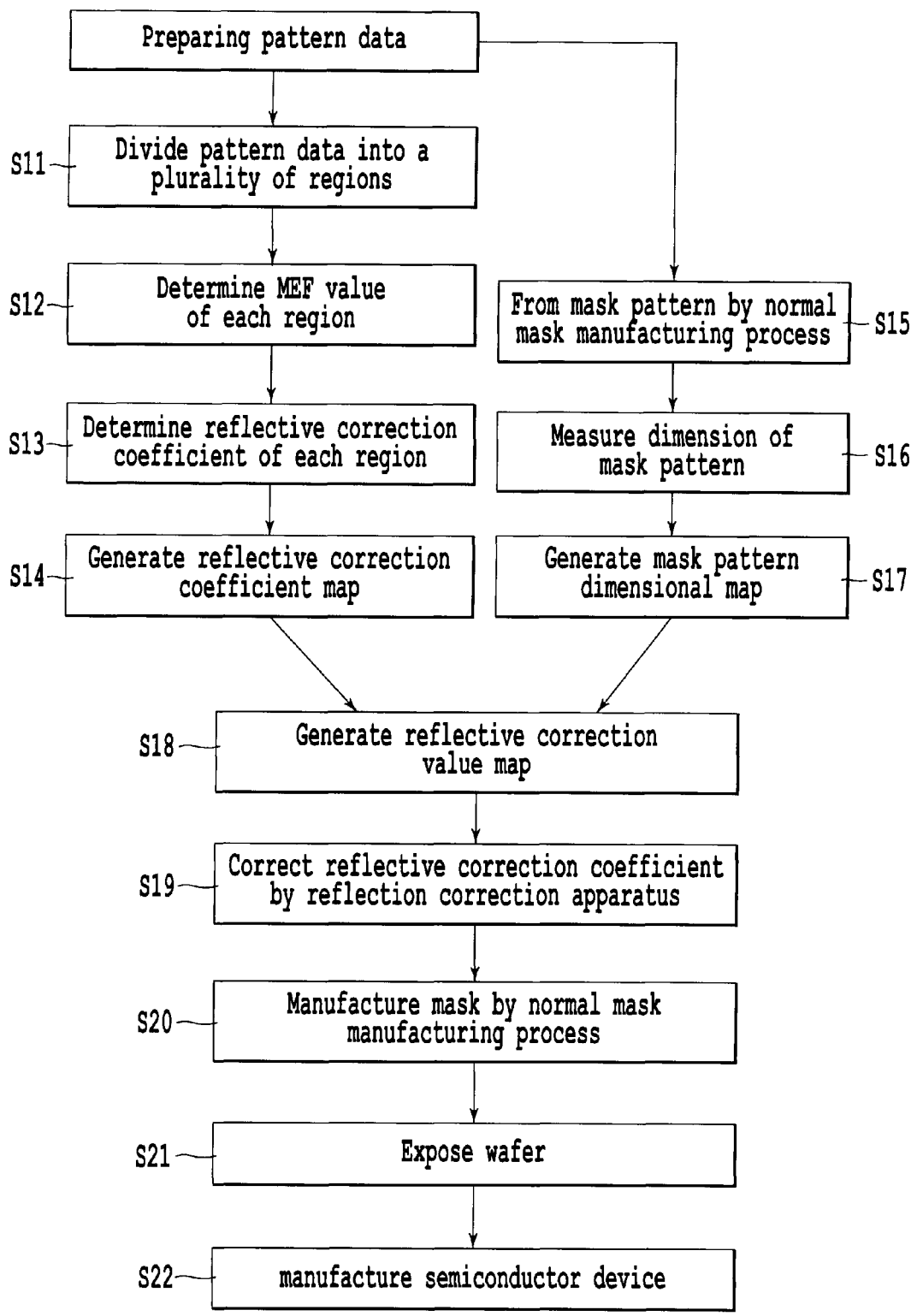
FIG. 6 is a flowchart showing a photomask manufacturing process according to a second embodiment of the present invention.

FIG. 6 is a flowchart for explaining a photomask manufacturing method according to a second embodiment of the present invention. The basic process of the second embodiment is the same as that of the first embodiment. The second embodiment is different from the first embodiment in determining a reflection correction coefficient on the basis of an MEF (Mask Error enhancement Factor) value set for each region in the mask.

The MEF is given by: MEF=(mask magnification)×(dimensional fluctuation of pattern actually formed on wafer from design position)/(dimensional fluctuation of pattern actually formed on mask from design position). As the current wafer exposure apparatus adopts ¼ reduction transfer, the mask magnification is normally 4. When a pattern to be transferred is sufficiently large, the MEF value becomes almost 1. In this case, the dimensional fluctuation of a pattern formed on a wafer from a design position is equivalent to ¼ that on a mask. That results because the wafer exposure apparatus adopts ¼ reduction transfer.

However, in a background EUV lithography process for forming a micropattern the MEF value becomes 2 or more because the dimensional fluctuation of a pattern formed on wafer from a design position becomes more sensitive than that on mask. For example, when both of a fine pattern and a rough pattern are formed on the same mask, a fine pattern may need to undergo reflection correction by 1% per nm, while a rough pattern may need to undergo reflection correction by 0.5w per nm. Hence, the adjustment of the reflection correction coefficient for the fine pattern may result in overcorrection of the rough pattern. As described above, the background method of changing the reflection coefficient of the reflective layer to correct the pattern dimensions cannot accurately correct the reflection coefficient because the MEF value changes depending on the pattern dimensions.

As shown in FIG. 6, in the second embodiment, as in the first embodiment, 80-mm-square pattern data to be formed on a mask is divided into 1 mm-square regions (subregions) (step S11). A maximum MEF value within each region is determined as a MEF value of each region (step S12). Reflection correction coefficients as shown in FIG. 2 are determined on the basis of these MEF values (step S13). The relationship between the MEF value and the reflection correction coefficient is uniquely determined and generally expressed by a linear equation. That is, (reflection correction coefficient)= A×(MEF value)+B, in which A and B are preset constants. A reflection correction coefficient map is generated on the basis of the determined reflection correction coefficients of the respective regions (step S14).

Next, a reflective layer made of, for example, Mo/Si films is formed on a substrate and an absorber pattern made, for example, mainly of Ta is formed on the layer by the normal EUV mask manufacturing process (step S15). After forming the absorber pattern, this photomask undergoes defect inspection and defect correction. The dimensions of the formed absorber pattern are measured with SEM. Then, for example, 441 points within the 80-mm-square pattern are measured at a pitch of 4 mm (step S16). On the basis of this measurement data, an 80-mm-square pattern dimensional map as shown in the first embodiment is generated (step S17).

On the basis of the reflection correction coefficient and the pattern dimensional map, a reflection correction value is determined for each 1 mm-square region (step S18). Subsequently, as in the first embodiment, the reflection coefficient is decreased by following the reflection correction value map using a laser reflection correction apparatus (step S19).

As in the first embodiment, using the normal photomask manufacturing process, the mask undergoes cleaning and pellicle adhesion to complete a photomask (step S20). This photomask is set on an EUV exposure apparatus to transfer a device pattern having a half pitch of 32 nm onto a resist (step S21). Furthermore, the wafer is etched using the resist as a mask to manufacture a semiconductor device (step S22). Consequently, the uniformity of the pattern dimensions improves as compared with the background art. This increases the margin of lithography to be able to greatly improve the semiconductor device manufacturing yield.

According to the second embodiment, in addition to operations in the first embodiment, the MEF value of each predetermined region within the mask plane is calculated to determine the relationship between the MEF value and the reflection correction coefficient in advance (step S12). This makes it possible to correct the reflection coefficient of the absorber layer with a higher accuracy than in the first embodiment. It is therefore possible to manufacture a very fine semiconductor device having an half pitch as narrow as 32 nm or less with a high yield.

A third embodiment of the present invention is now explained. This embodiment can be applied to either the first or second embodiments, but in this third embodimention implantation is used in place of laser beam irradiation for reflection correction. The explanation of the same processes described in the first and second embodiments is omitted below.

In the third embodiment, as shown in FIG. 3(b'), reflection correction is performed by implanting ions 18 into the reflective layer 11 and forming an ion implanted layer 19, according to the reflection correction coefficient map which is generated (in steps S7 or S18) based on the reflection correction coefficient map (generated in steps S3 or S14) and the pattern dimensional map (generated in steps S6 or S17). An ion implantation apparatus used in this implanting of ions for example has a variable aperture that adjusts a size of an ion implanted region. In this embodiment, the aperture in the apparatus is controlled to adjust the size of an ion implanted region in one shot for each 1 mm-square pattern data region, when the ion implantation is being performed.

For example, the implanted ions 18 are Mo ions. The ion implantation amount is changed for each 1 mm-square region in the range from $2 \times 10^{14}$ to $5 \times 10^{14}$ ions/cm$^2$ to decrease the reflection coefficient by following the reflection correction value map. FIG. 7 is a graph showing a relationship between the amount of ions implanted into the reflection layer and a changing rate of reflection coefficient of the layer in this example. According to the relationship, the reflection coefficient is decreased with an increase of the ion implantation amount. This is because when the Mo ions are implanted into the reflective multiple-layer, the optical constant of the Mo film is not changed but that of the Si film is changed, and as a result the difference between the optical constant of the Mo film and that of the Si film becomes reduced and the reflection coefficient of the reflective film becomes lower.

After reducing the reflection coefficient of the layer, using the normal photomask manufacturing process, the EUV mask is manufactured. This photomask is set on the EUV exposure apparatus to transfer a device pattern having a half pitch of 32 nm onto a resist. Then, it is confirmed that the uniformity of the pattern dimensions improves as compared with the background art. This increases the margin of lithography to be able to greatly improve the semiconductor device manufacturing yield.

The present invention is not particularly limited to the above-described embodiments. For example, it is possible to appropriately select the average MEF value of a plurality of patterns within each region, a maximum MEF value of a plurality of patterns within each region, or the intermediate MEF value between the average MEF value and the maximum MEF value. Alternatively, the MEF value of a representative pattern (an important pattern whose dimensions are strictly managed) within each region may be selected. The inventors of the present invention confirmed that the use of a maximum MEF value is likely to result in slight overcorrection, while the use of the average MEF value is likely to result in slight undercorrection. Hence, the use of the intermediate MEF value between the average MEF value and the maximum MEF value may be preferable.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask manufacturing method comprising:
preparing a photomask having a reflective layer formed on a substrate and an absorber pattern formed on the reflective layer;
generating a pattern dimensional map on the photomask, the pattern dimensional map indicating distribution of a dimensional difference between a measured value of the absorber pattern and a design value of the absorber pattern;
generating a reflection correction coefficient map by dividing a mask region, where the absorber pattern is formed, into a plurality of subregions and determining a reflection correction coefficient for each subregion;
calculating a reflection correction value of each subregion based on the dimensional difference indicated in the pattern dimensional map and the reflection correction coefficient of each subregion; and
changing a reflection coefficient of each reflective layer region corresponding to each subregion based on the reflection correction value.

2. A method according to claim 1, wherein the reflection correction coefficient for each subregion is determined based on the design value of the absorber pattern in each subregion.

3. A method according to claim 2, wherein the reflection correction coefficient for each subregion is determined in accordance with an average pitch of the absorber pattern within each subregion.

4. A method according to claim 1, wherein the reflection correction coefficient for each subregion is determined based on a mask error enhancement factor (MEF) value of the absorber pattern within each subregion.

5. A method according to claim 4, wherein the MEF value is selected from one of an average MEF value of the absorber pattern within each subregion, a maximum MEF value of the absorber pattern within each subregion, or an intermediate MEF value between the average MEF value and the maximum MEF value.

6. A method according to claim 1, wherein the changing the reflection coefficient of the reflection layer is reducing the reflection coefficient of the reflection layer.

7. A method according to claim 6, wherein the reducing the reflection coefficient of the reflective layer includes forming a heterogeneous region in the reflective layer, the reflection coefficient of the heterogeneous region being lower than that of other reflective layer regions.

8. A method according to claim 7, wherein the reducing the reflection coefficient of the reflective layer includes irradiating a laser beam into the reflective layer to form the heterogeneous region.

9. A method according to claim 6, wherein the reducing the reflection coefficient of the reflective layer includes implanting ions into the reflective layer.

10. A method according to claim 9, wherein the ions implanted into the reflective layer include Molybdenum ions.

11. A semiconductor manufacturing method comprising:
preparing a photomask having a reflective layer formed on a substrate and an absorber pattern formed on the reflective layer, the photomask manufactured by generating a pattern dimensional map on the photomask, the pattern dimensional map indicating distribution of a dimensional difference between a measured value of the absorber pattern and a design value of the absorber pattern, generating a reflection correction coefficient map by dividing a mask region, where the absorber pattern is formed, into a plurality of subregions and determining a reflection correction coefficient for each subregion, calculating a reflection correction value of each subregion based on the dimensional difference indicated in the pattern dimensional map and the reflection correction coefficient of each subregion, and changing a reflection coefficient of each reflective layer region corresponding to each subregion based on the reflection correction value; and
transferring the pattern of the photomask onto a wafer using the photomask.

12. A method according to claim 11, wherein the reflection correction coefficient for each subregion is determined based on the design value of the absorber pattern in each subregion.

13. A method according to claim 12, wherein the reflection correction coefficient for each subregion is determined in accordance with an average pitch of the absorber pattern within each subregion.

14. A method according to claim 11, wherein the reflection correction coefficient for each subregion is determined based on a mask error enhancement factor (MEF) value of the absorber pattern within each subregion.

15. A method according to claim 14, wherein the MEF value is selected from one of an average MEF value of the absorber pattern within each subregion, a maximum MEF value of the absorber pattern within each subregion, or an intermediate MEF value between the average MEF value and the maximum MEF value.

16. A method according to claim 11, wherein the changing the reflection coefficient of the reflection layer is reducing the reflection coefficient of the reflection layer.

17. A method according to claim 16, wherein the reducing the reflection coefficient of the reflective layer includes forming a heterogeneous region in the reflective layer, the reflection coefficient of the heterogeneous region being lower than that of other reflective layer regions.

18. A method according to claim 17, wherein the reducing the reflection coefficient of the reflective layer includes irradiating a laser beam into the reflective layer to form the heterogeneous region.

19. A method according to claim 16, wherein the reducing the reflection coefficient of the reflective layer includes implanting ions into the reflective layer.

20. A method according to claim 19, wherein the ions implanted into the reflective layer include Molybdenum ions.